United States Patent [19]
Cauchy

[11] Patent Number: 4,520,305
[45] Date of Patent: May 28, 1985

[54] THERMOELECTRIC GENERATING SYSTEM

[76] Inventor: Charles J. Cauchy, 935 Lincoln St., Traverse City, Mich. 49684

[21] Appl. No.: 524,041

[22] Filed: Aug. 17, 1983

[51] Int. Cl.³ .............................................. H02N 0/00
[52] U.S. Cl. .................................... 322/2 R; 310/306; 136/208
[58] Field of Search ...................... 310/306; 322/2 R; 136/208, 227

[56] References Cited

U.S. PATENT DOCUMENTS

| | | | |
|---|---|---|---|
| 3,079,515 | 2/1963 | Saldi | 310/306 |
| 3,234,412 | 2/1966 | Sankovich et al. | 310/306 X |
| 3,719,532 | 3/1973 | Falkenberg et al. | 310/306 X |
| 3,969,149 | 7/1976 | Thomas et al. | 136/208 X |

OTHER PUBLICATIONS

Ashrae Handbook, pub. 1977 by American Society of Heating, Refrigeration & A/C Engineers, pp. 1.28, 1.29.

*Primary Examiner*—R. J. Hickey
*Attorney, Agent, or Firm*—Flynn, Thiel, Boutell & Tanis

[57] ABSTRACT

A thermoelectric electricity generating system for connection with a heat source and a heat acceptor respectively by first and second elongate plates of substantially constant cross section and high heat and electrical conductivity. A plurality of flat platelike thermoelectric members engage and are firmly sandwiched between the first and second plates. Thin surface layers of low electrical conductivity, but high heat transfer capability across the thickness thereof, are interposed between the thermoelectric members and first and second plates. The first plate may connect with a heat source by fitting in an opening in the wall of a fuel fired heater, to thereby apply a temperature drop across the thermoelectric members and thereby generate electricity.

21 Claims, 16 Drawing Figures

THERMOELECTRIC GENERATING SYSTEM

FIELD OF THE INVENTION

The invention relates to thermoelectric electricity generating systems, and more particularly to systems employing a plurality of flat platelike thermoelectric members.

BACKGROUND OF THE INVENTION

Flat platelike thermoelectric electricity generating members are available which have an array of heatable thermocouple junctions on one side thereof and a corresponding plurality of coolable thermocouple junctions on the opposite side thereof. However, such thermocouple members are, in general, not directly engageable with hot combination gases, such as in the interiors of fuel fired stoves or the like, nor with cooling air or water, in an efficient and practical manner for electricity generation.

There has been a long felt need throughout the world, particularly in remote, underdeveloped and/or wild geographic areas, where commercial central electric power generating plants are not accessible, for electricity at moderate cost.

Small diesel or gasoline engine powered rotary generators have been found to be less than entirely satisfactory due to their disadvantageous need for special fuel which may be costly or require transportation over large distances, capital cost, difficulty of repair, noise, limited service life due to wearing out of rotating and reciprocating parts, need for sophisticated maintenance skills and incompatibility with local fuel burning devices.

Further, attempts to utilize photovoltaic devices (so-called solar cells) for such electricity generating purposes have also proved to be less than entirely satisfactory. Initial capital cost is high due to the cost of large square footage areas of photovoltaic cells required. Initial capital cost and maintenance costs also tend to be relatively high due to the need for a relatively large storage battery bank, this need being compounded by the fact that even on sunny days only about four hours per day of fully effective photovoltaic generating capability is available and not all of the days of the year will be sunny, even in areas with little annual rainfall. Indeed, in geographic areas with the significant number of overcast or rainy days, or where daylight hours are very short for a significant portion of the year, photovoltaic electric generating systems have appeared to be impractical.

On the other hand, it is estimated that about two-thirds of the world population burns fuel for heating and cooking purposes and this is the case in many of the world's remote, unimproved or wild areas where commercial central electric power plants are not available. It is estimated that a system in accord with the present invention can provide electric power for perhaps one-third or one-half the cost of a photovoltaic system, per watt output, without counting the benefit of water heating, space heating and so forth as an extra output of the present system. For comparable weekly or monthly electric power output, a thermoelectric system in accord with the present invention may require only one-quarter to one-fifth the battery storage, and require a smaller battery charging and regulating device. In particular, apparatus according to the present invention can be operated effectively not merely during the four peak sunlight hours of the day, but for up to 24 hours a day or whenever fuel may be burned by the user for other purposes, such as cooking, building heating, or small scale household, commercial or light industrial purposes. Moreover, the electricity generating apparatus of the present invention is compact and capable of installation in portable heating apparatus, existing on-site heating apparatus, or specially constructed fuel burning devices. Special fuels are not required and whatever is available locally can be utilized.

The need for some electrical generation capability in such remote, etc. areas is clear and long-standing. Electric powered cooling for certain medications and other hospital or medical needs, electric power for radio or telecommunications for remote villages, and remote community lighting are a few examples.

Accordingly, it is an object of this invention to provide a thermoelectric electricity generating system of relatively simple construction, relatively low capital cost, and long operating life, which can be implemented with few or no moving parts, which is suitable to portable or remote use in primitive areas of the world, and which should have a relatively long operating life with little or no maintenance requirement.

It is a further object of the invention to provide a system, as aforesaid, adaptable to local fuel and heating sources with a minimum in the way of tools and skills.

The objects and purposes of the invention include provision of a thermoelectric electricity generating system for connection with a heat source and heat acceptor in the form of a source of fluid at a temperature less than that of the heat source. The system includes first and second platelike thermoelectric members having opposed surface layers of low electrical conductivity but which permit maximum heat transfer across the thickness thereof. A plurality of flat platelike thermoelectric members are spaced edge-by-edge in a recess in at least one of the plates in snugly sandwiched, heat conductive relation with the opposed surface layers of the first and second plates. Thermoelectric members comprise a plurality of heatable junctions and a plurality of coolable junctions respectively in heat conducting relation with the first and second plates, such that the heat source and heat acceptor respectively acting on the first and second plates cause the thermoelectric members to generate electricity.

Other objects and purposes of the invention will be apparent from reading the following specification and inspecting the accompanying drawings.

DETAILED DESCRIPTION

FIGS. 1-4A discloses a thermoelectric system in which a thermoelectric device 12 thermally couples opposite sides of a plurality of flat, platelike thermoelectric members 16 respectively to a heat source and heat acceptor respectively indicated schematically at HS and HA, for production of DC electric power by such thermoelectric members 16.

Figure 3:
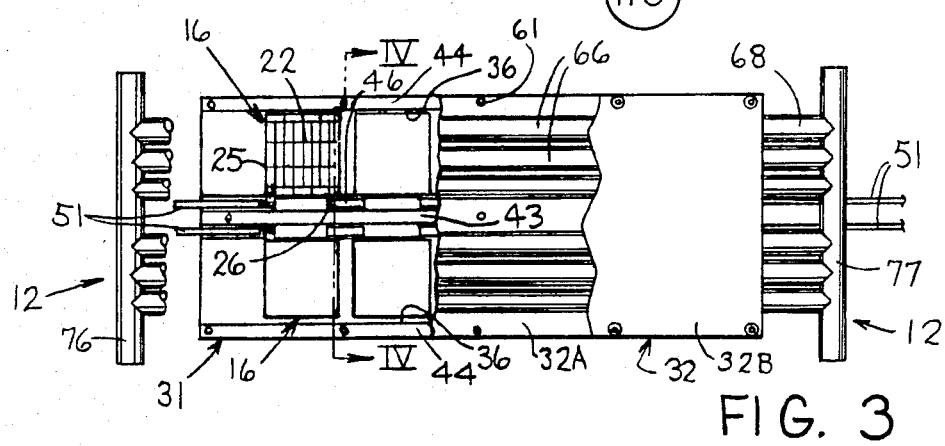
FIG. 3 is a partially broken sectional view substantially taken on the line III—III of FIG. 1, with liquid tubes and headers installed on the coolable plate of the FIG. 1 device.
Figure 4A:
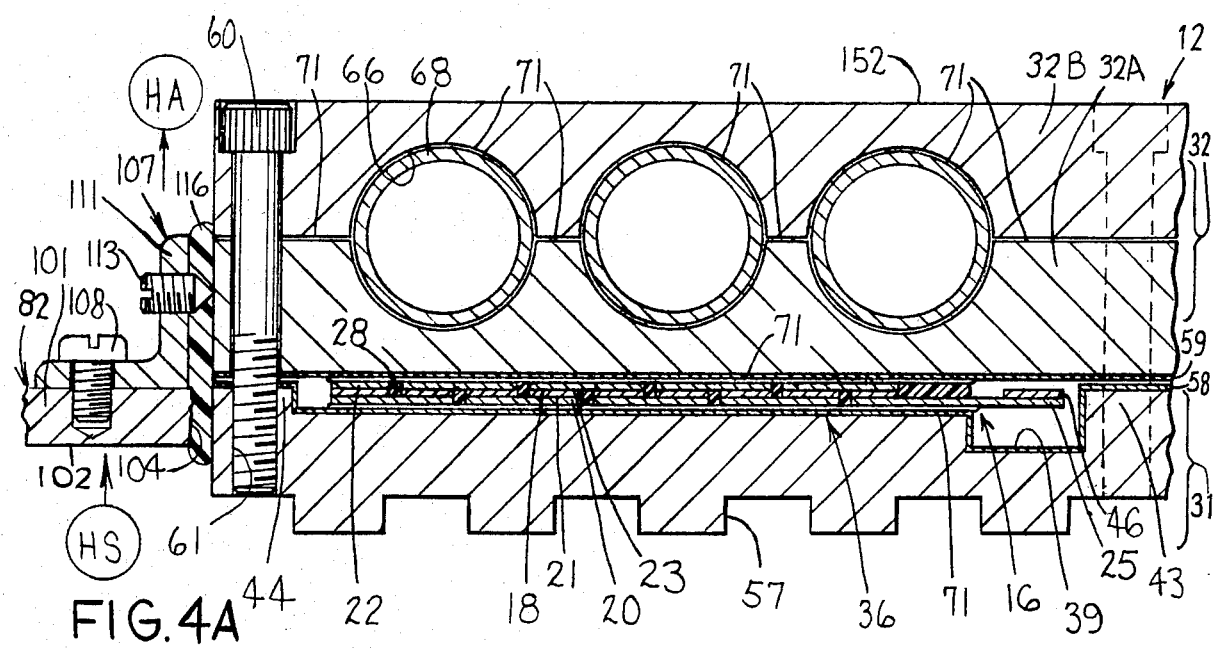
FIG. 4A is an enlarged fragment of FIG. 2 showing the liquid tubes installed in the coolable plate in accord with FIG. 3.
Figure 4B:
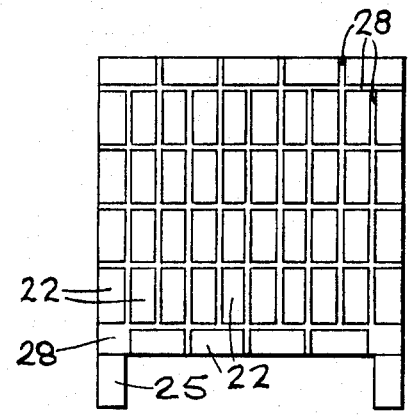
FIGS. 4B and 4C are fragmentary top and bottom views, respectively, of one of the thermoelectric members of FIGS. 2–4A.
Figure 4C:
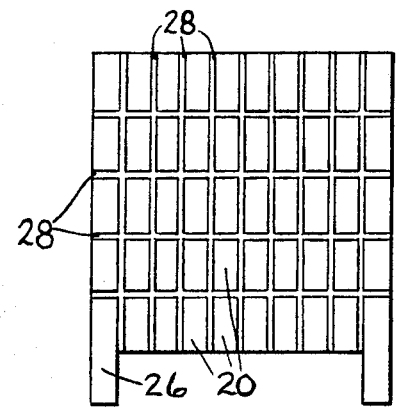

The thermoelectric members 16 may be of a conventional kind. The basic construction of flat, platelike thermopiles in three layers is known, an example being shown in the *A.S.H.R.A.E. Handbook*, published in 1977 by American Society of Heating, Refrigeration and Air Conditioning Engineers, in reference to FIG. 34 at page 1-29. In the embodiment shown in FIGS. 3 and 4A, each thermoelectric member 16 is constructed as a pair of outer layers sandwiching a middle layer therebetween. The middle layer comprises a plurality of laterally spaced blocks 18 of a first thermocouple material arranged in columns and rows (for example 100 such blocks in a 10 by 10 array). The lower layer (FIG. 4A) comprises rectilinear links 20 of a second thermocouple material each electrically conductively abutting the bottoms of two adjacent blocks 18 in fixed relation to form with each a heatable thermocouple junction 21. The top layer comprises a further plurality of rectilinear links 22 of said second material, each preferably identical to the lower links 20 and electrically conductively abutting the tops of two adjacent blocks 18 in fixed relation to form with each a corresponding coolable thermocouple junction 23. By offsetting, by the lateral width of a block 18, the upper links 22 with respect to the lower links 20, it is possible to connect all of the junctions 21 and 23 in the thermoelectric member 16 in series with heatable junctions 21 alternating with coolable junctions 23 throughout the series. This forms a platelike thermopile whose output voltage is taken from the last two links in the series which are here extended and indicated at 25, 26 (FIGS. 3 and 4A) so as to provide a DC voltage across the output terminals 25 and 26 which at least generally approximates the sum of voltages developed by the individual pairs of thermocouple junctions 21, 23. To mechanically fix the blocks 18 and links 20, 22 and output terminal links 25 and 26 into a mechanically rigid platelike unit, the spaces between the elements are preferably filled with a high temperature tolerant, high electrical resistance and high dielectric constant material, such as a high temperature epoxy or the like potting material 28. The particular pattern of bottom links 20 and top links 22 can of course vary but one convenient pattern is shown at FIGS. 4B and 4C respectively taken from the top and bottom of the FIG. 4A thermoelectric member 16. The above-mentioned first and second materials are appropriate metals or semiconductor materials and are selected to provide the desired DC voltage output in the temperature range at which the thermoelectric member 16 is to be used, for example, a bismuth-telluride alloy, here $(BiSb)_2(SeTe)_3$, and copper, respectively. Thermoelectric members of the kind above discussed at 16 are known and are commercially available from suppliers such as Borg-Warner Corporation located at Chicago, Ill. In the embodiment shown, the thermoelectric members 16 were (except for the extending output terminals 25 and 26) about 2 inches by 2 inches square with a thickness of about ⅛ inch.

The thermoelectric device 12 comprises first and second (respectively heatable and coolable) plates 31 and 32 (FIGS. 1, 2 and 4A) for housing a plurality of the flat thermoelectric members 16 therebetween and thermally coupling the heatable and coolable junctions 21 and 23 thereof with the heat source and heat absorber HS and HA respectively. The first and second plates are of good heat conducting material. The material is preferably aluminum which provides substantial advantages of low cost, extrudability, and, as discussed hereafter, the capability of being provided with an anodized surface.

In the embodiment shown in FIGS. 1-4A, the second plate 32 comprises two half-thickness parts, namely subplates 32A and 32B, as hereafter discussed.

Figure 1:
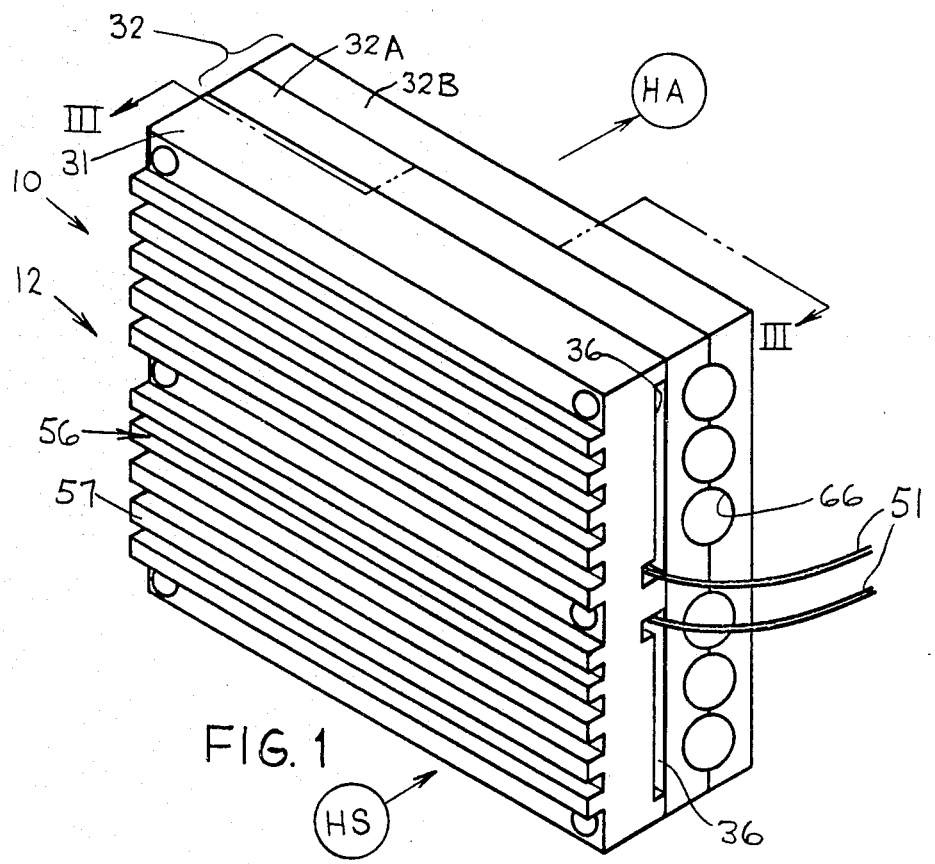
FIG. 1 is a pictorial view of a thermoelectric device embodying the invention.
Figure 2:
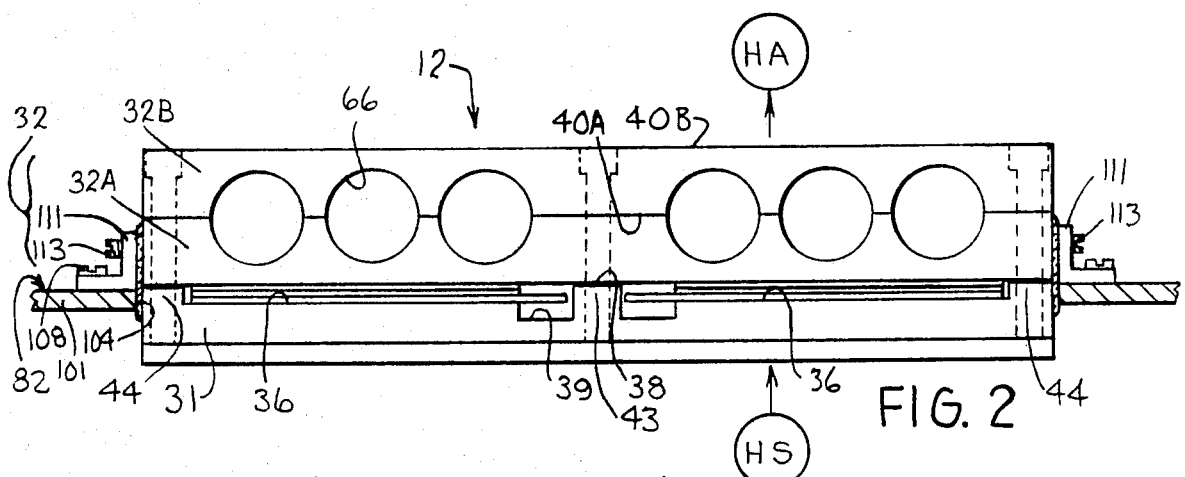
FIG. 2 is an end view of the thermoelectric device of FIG. 1 installed as a portion of the wall of a combustion chamber of a heat source.

To snugly accommodate the thermoelectric members 16 between the first and second plates 31 and 32, the interface 34 therebetween is provided with a recess 36. In the FIGS. 1-4A embodiment, to advantageously permit two subplates 32A and 32B to be identical (preferably separate cut lengths of a common extrusion for low cost), the thermoelectric member receiving recess 36 is provided entirely in the opposing inner surface 38 of the first plate 31, and the oppositely facing surfaces 40A and 40B of the second plate 32 are preferably flat. The recess 36 preferably runs the full length of the plate 31 and preferably is extruded therein. The recess 36 is long enough to accept a plurality of thermoelectric members 16 arranged loosely edge-by-edge as seen in FIG. 3 and is wide enough to provide some clearance space between its side walls and the opposed edges of the thermoelectric members 16, as seen in FIG. 2. To provide more room vertically in FIGS. 2 and 4A for electrical connections to the output terminals 25 and 26 of each thermoelectric member 16, the adjacent length edge portion of the recess 36 is provided with a deeper subrecess 39.

It is convenient to provide two such recesses 36 side-by-side and separated by a thin central raised portion 43 of the same height as correspondingly thin (in any lateral direction) raised edge portions 44 (FIGS. 2 and 3). The two recesses 36 are in mirror image relation such that their subrecesses 39 are close together and separated only by the central raised portion 43.

Thus, with a plurality of thermoelectric members 16 arranged loosely side-by-side in each of the two longitudinally extending recesses 36, their adjacent output terminals 25 and 26 can be connected in series by further rectilinear conductive links 46 and the bared ends of output conductors, as at 51 (FIG. 3), preferably provided with high temperature insulation along their lengths, are electrically connected to the endmost output terminals of the outermost thermoelectric elements 16 for example as indicated in FIG. 3. If it be desired to connect in series all of the thermoelectric members 16 of a given thermoelectric device 12, the rightward ones of the conductors 51 can be interconnected so that the output voltage of the array appears across the two leftward conductors 51. Alternately, the rightward conductors 51 can be left separated for connection to the leftward conductor pair of another thermoelectric device 12 to the right thereof and not shown. Thus, thermoelectric devices 12 can be electrically connected to each other or to a load to be driven, in a variety of ways, as desired. Electrical connection of the links 46 and conductors 51 to the thermoelectric member output terminals 25 and 26 can be by conventional high temperature solder. Indeed, a conventional high temperature solder can be utilized within the thermoelectric members 16 to assure good electrical contact at the junctions 21 and 23.

The outward facing side 56 (FIG. 1) of the first plate 31 is shown with a plurality of fins 57, defined by intervening grooves which extend horizontally in FIG. 1 for purposes discussed hereinafter with respect to FIGS. 5, 6 and 13.

The opposing inner surfaces of the first and second plates 31 and 32 are each preferably provided, across the width and length thereof, with a respective special thin surface layer 58 and 59 (FIG. 4A) which provides little or no impediment to transfer of heat thereacross from plate 31 to thermoelectric member 16 to second plate 32, but which provides very high electrical resistance and dielectric strength, so as to avoid any significant electrical shorting between the links 20 or the links 22 due to the wide area pressing contact of the first and second plates 31 and 32 thereagainst. These surface layers 58 and 59 are thin (preferably about 1 mil, namely 0.001 inch and less than 3 mils) anodized layers, in the preferred embodiment shown formed by the Hartcoat process, commercially available from NAARCO, located at Kalamazoo, Mich. The anodized surface layer 58 will be understood to cover the bottom of each recess 36. Such anodized layers typically have a dielectric strength of 660 volts per mil and a heat conductivity of 160 BTU inch per square foot hour °Fahrenheit.

An alternate coating is available from Aremco Products Inc., located at Ossining, N.Y. as model 574-MF thermal grease, being oil based with aluminum particles therein. Dielectric strength appears adequate, temperature resistance is to 600° Fahrenheit, and thermal conductivity is high across a ½ mil layer.

Another alternate coating is Teflon, having a dielectric strength of 450 volts per mil and a thermal conductivity of 20.4 BTU inch per square foot hour °Fahrenheit usable in ½ mil thickness, and having a temperature resistance to 260° C.

To maximize the effective area of face-to-face contact by compensating for minor surface pitting and other irregularities, a heat conductive but high dielectric strength grease 71 here covers the opposite surfaces of the thermoelectric member 16 opposed to the plates 31 and 32. The grease 71 may be used in conjunction with the anodized layers 58 and 59 (which then provide added protection against shorting between links 20, 22) or, less preferred without the anodized layers.

The heat conductive grease 71 comprises a high temperature carrier grease which does not thin sufficiently to run out of the interfaces between the above-named surfaces at least up to 300° C. or so and which is filled with heat conductive alumina powder (ground aluminum oxide). In FIG. 4A the thermal grease 71 is normally kept to about 1 to 2 mils thickness and heat transfer approximates direct metal-to-metal contact over the entire surface area located therewith. A suitable heat conductive grease is available from Aremco Products, Inc., located at Ossining, N.Y.

In one embodiment the grease 71 used had a dielectric strength of 550 volts per mil and a heat conductivity of 60 BTU inch per square foot hour °Fahrenheit.

To firmly sandwich the members 16 between the plates 31 and 32, screws 60 extend through the second plate 32 and engage threaded holes 61 spaced along the narrow raised portions 43 and 44. Thus, the plates 31 and 32 and sandwiched thermoelectric members 16 define a unitary module applicable to generate electricity as hereafter discussed.

Conduction of heat from the first plate 31 to the second plate 32 directly (not through the thermoelectric members 16) is minimized by widely spacing the screws 60, making the recesses 36 slightly shallower than the members 16, such that the narrow raised edge portions 43 and 44 are spaced by an about 1/32" air gap, and making the remaining portions between the opposing inner surfaces of the first and second plates wider air gaps, which air gaps are heat insulative.

Particularly in areas wherein humidity or moisture may be high, to avoid possible damage to special material of the devices 16, e.g. poisoning of bismuth telluride blocks 18, it may be desired to in fact seal off the interior area between the plates 31 and 32 by inserting into the air gaps between subplate 32A and the ridges 43, 44 and the areas in the recesses and subrecesses 36 and 39, a suitable material which is highly resistant to heat transfer and to moisture transmission. For example, the crevices between the plates 31 and 32, except where occupied by the thermoelectric members 16, may be stuffed with glass fibers in conventional mat form, the assembly may then be heated up to about 180° F. to drive moisture out, and then the edge of the glass fiber material visible between the edges of plates 31 and 32 may be painted with a flexible ceramic material of a kind that remains flexible enough to absorb thermal expansion and contraction shock and provides a moistureproof coating. Such a ceramic material is available from Aremco Products, Inc. of Ossining, N.Y. Another possible moisture seal material that can be painted on would be a high temperature epoxy material which when heated tends to become more flexible for absorbing thermal expansion and contraction of the plates.

In the embodiment shown in FIGS. 1–4A the second plate 32 is liquid cooled. To this end, the second plate 32 includes a plurality (here three) of parallel elongate passages 66 extending longitudinally of the second plate 32 and clustered about and adjacent each recess 36 in the first plate 31. Except for the passages 66, the opposed surfaces of the subplates 32A and 32B are flat to ensure maximum area surface contact and heat transfer therebetween. Tubes of highly thermally conductive material, preferably commercially available copper tubes, extend snugly through and beyond each of the passages 66. By making the second plate 32 of two identical subplates oriented in mirror imaged relation, half the cross section of each passage 66 is provided as a groove in the inner side face of each subplate 32A and 32B, such that with the screws 60 tightened, the tubes 68 (FIG. 4A) are clamped in heat conducting relation between the two subplates 32A and 32B. To maximize the contact for heat transfer, the above-mentioned heat conductive grease 71 (FIG. 4A) is used to cover the opposed surfaces of the subplates 32A and 32B and of the passages 66 and tubes 68 to maximize conduction of heat from the upper or coolable side of the thermoelectric members 16 (and hence from the coolable thermocouple junctions 23 thereof) to cooling liquid in the tubes 68. By accurate formation of the opposing inner surfaces of subplates 32A and 32B and of passages 66, the thickness of heat conductive grease 71 required is minimized, which further minimizes resistance to heat transfer thereacross.

In the embodiment shown in FIG. 3, the opposite ends of the tubes 68 extend beyond the ends of the plates 31 and 32 and fixedly communicate with a vertically extending header tube 76 or 77 near (for example within an inch or two) the corresponding left or right end of the plates 31 and 32. The connection of the header tubes 76 and 77 to the ends of the tubes 68 can be by conventional soldered connection.

Instead of using the above-described grease material, the thin layers 71 may be of a high temperature epoxy adhesive filled with aluminum particles and also available from Aremco Products, Inc., above mentioned. In one embodiment the adhesive used at 71 had a dielectric strength of 80 volts per mil and a heat conductivity of 20 BTU inch per square foot hour °Fahrenheit. While of somewhat lesser dielectric strength and heat conductivity than the above-mentioned grease material, electrical output has been found satisfactory and the adhesive alternative eliminates the need for the screws 60 and allows the device 12 to be made as a permanent one-piece unit, which may be advantageous for low cost manufacturing in volume and for long term durability in use.

Figure 8:
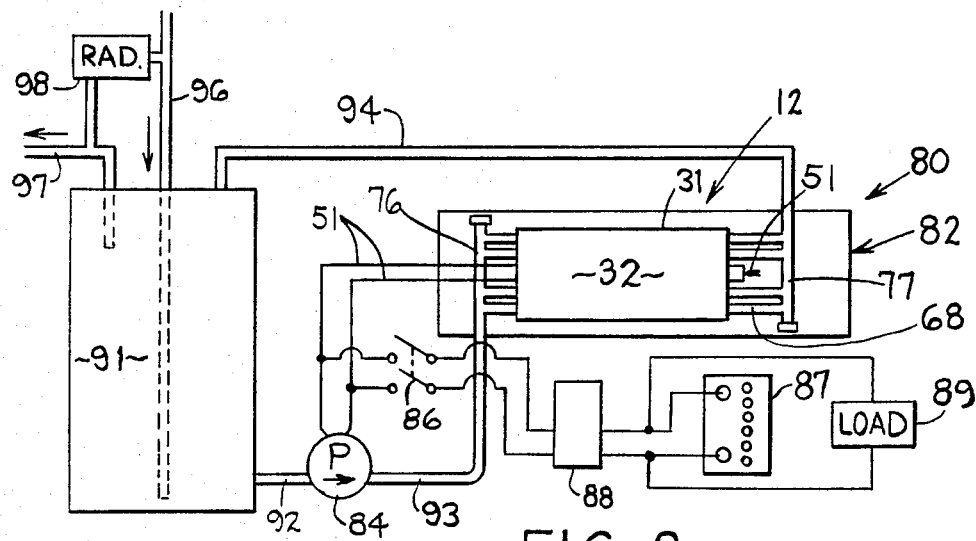
FIG. 8 is a schematic view showing electrical and coolant liquid circuitry usable with the FIGS. 1-7 apparatus.

FIG. 8 discloses schematically an example of a system 80 in which the above-discussed thermoelectric device 12 of FIGS. 1-4A is usable. The system 80 includes a heat source 82 capable of heating the first plate 31 of the thermoelectric device 12 to temperatures of at least 75° C. and up to about 220° C., for example a fuel burning device. Such a fuel burning device can be a conventional heating or cooking stove, furnace, kiln, or other existing fuel burning device, or may be a specially constructed one as hereafter discussed with respect to FIGS. 5, 6 and 13. The device 12 is secured to the heat source 82 in a manner to apply heat therefrom to the first plate 31 thereof. In the example shown, the rightward electric output conductors 51 are connected, to connect all the thermoelectric members 16 in series and the leftward electric output conductors 51 are connected to drive a water pump 84 and (here through a manually operable switch 86) to charge a storage battery 87, preferably through a conventional overcharge preventer 88. An electric load 89 may be connected across the battery terminals, for energization by electric power stored in the battery 87 as a result of charging current from the thermoelectric device 12. Overcharge preventer 88 also functions conventionally to prevent application of excessively high voltages by the device 12 to the battery 87 and to prevent discharging of the battery 87 back through the device 12 when the heat source 82 is cool. Preventers 88 are commercially available, for example as manufactured by SCI and available through Western New England Solar, located at Holyoke, Mass. The use of such charge regulating devices 88 for storage batteries has long been conventional.

The load 89 may for example be electric lighting, radio or telecommunications equipment, refrigeration equipment or the like having a voltage rating corresponding to that of the battery 87 and, in the absence of voltage transformation, to the output voltage available across the conductors 51, e.g. a nominal 12 volts. The total wattage of the load 89 can be large compared to the instantaneous wattage available from the device 12 if the load is operated infrequently for short periods of time and the device 12 is correspondingly operated more frequently for longer periods of time.

In FIG. 8, a water storage tank 91 is connected in series loop through pipes 92, 93, 94 with the pump 84 and, through header tubes 76 and 77, with the cooling tubes 68 of the device 12, such that heat extracted from the plate 32 to cool same for purposes of electric power output on conductors 51, is applied through the coolant loop 91-94 to increase the temperature of water in the tank 91. The FIG. 8 system thus produces two useful energy outputs, namely electric power on lines 51 and hot water at tank 91. Efficiency is about 3 to 5% as to conversion of thermal BTU's to electrical BTU's, such that the other 95 to 97% of the thermal BTU's are available for space heating, water heating and the like. In a conventional manner, inlet and outlet pipes 96 and 97 connect with the water tank 91. Pipe 97 may be used to supply hot water for use in bathing, cleaning or the like with make-up cool water being supplied to the tank through pipe 96. On the other hand, pipes 96 and 97 may be connected in loop with a warm water radiator 98 for space heating or the like.

Although the thermoelectric device 12 can be mounted on the outside surface of a heat source, such as a furnace, stove or the like, improved heat transfer and power output can be obtained by making the heatable first plate 32 itself a portion of the wall of the combustion or exhaust space of such a combustion heat source. In FIGS. 2 and 4A a wall 101, whose inner surface 102 bounds the combustion or exhaust space of a stove or the like 82, is provided with an opening 104 of width and length slightly larger than the width and length of the heatable plate 31 of device 12, providing a clearance of about 1/16 to ¼ inch therebetween when the first plate 31 is partially inserted from the outside of the stove 82 into the opening 104 in the manner seen in FIG. 4A. In that position, the fins 57 are directly in contact with heated gases within the stove 82 for maximum heat transfer to the plate 31. The stove wall 101 may be typically 3/16 inch to 5/16 inch thick steel plate or cast iron. Angle brackets 107 are rigidly secured as by screws 108 to the outside surface of the stove wall 101 at two opposite edges of the opening 104, preferably the edges parallel to the tubes 68. Flanges 111 of the brackets 107 extend outwardly from the stove wall 101 and flank the cool plate 32. The cool plate 32 is not permitted to extend into the opening 104. To minimize heat transfer from the bracket flange 111 to the cool plate 32, yet rigidly mount the device 12 to the stove wall, the area of contact between the flanges 111 and the edges of the cold plate 32 is kept extremely small by utilizing a few set screws 113 threaded through the opposed flanges 111 to engage with relatively pointed inner ends, and compressively sandwich therebetween, the plate 32 (here the inner subplate 32A thereof). Thus, the entire device 12 can be supported by two opposed brackets 107 and a total of four set screws, two per bracket. To avoid leakage of combustion gases outwardly through the clearance between the edge of opening 104 in stove wall 101 and the opposed edges of device 112, such clearance space is preferably filled with a conventional heat resistant stove cement 116, continued around all four sides of the device 12 and of sufficient flexibility as to avoid cracking and leakage due to normal heating and cooling of the stove 82.

In one tested device 12, incorporating 12 2-inch-by-2-inch (4 square inches) thermoelectric members 16 in series, temperature differentials across the plates 31 and 32 of 100° C., 150° C. and 200° C. were found to produce electric power outputs of about 1, 2 and 4 watts per square inch on lines 51.

Figure 5:
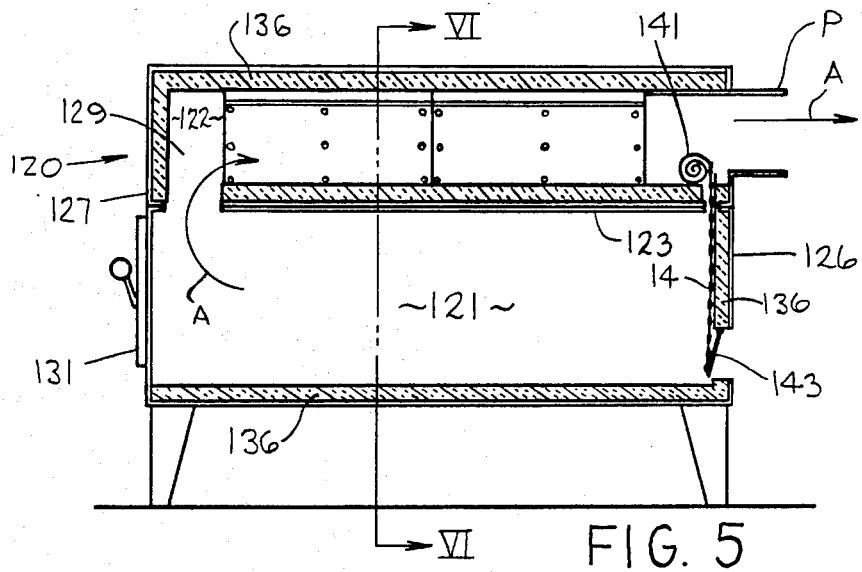
FIG. 5 is a central cross-sectional view, taken in elevation of special stove structure embodying the invention and with which the FIGS. 1-4A thermoelectric devices are usable.
Figure 6:
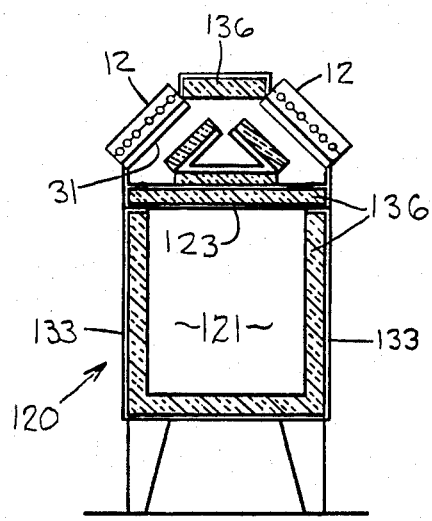
FIG. 6 is a cross-sectional view substantially taken on the line VI—VI of FIG. 5.

While the device 12 can thus be mounted on a heat source of any desired or immediately available type, FIGS. 5 and 6 disclose a preferred fuel burning heat source, particularly adapted to burning of solid fuels of the kind that may be available in underdeveloped, remote or wild geographic areas, such as wood, peat, grazing animal dung, etc., and which is intended to maximize efficient production of electricity (as well as hot water) from the device 12. FIGS. 5 and 6 thus disclose a heat source HS in the form of a special stove 120 of generally boxlike configuration. The interior is divided into a lower combustion chamber 121 and an upper exhaust chamber 122 by a substantially horizontal shelf 123 extending the width of the stove 120 for support on the sides thereof and extending from the back 126 of the stove to a location near to but spaced from the front 127 of the stove to provide a port area 129 for transfer of combustion gases from combustion chamber 121 into exhaust chamber 122. A conventional door 131 on the front wall 127 of the stove permits loading of solid fuel in the combustion chamber 121 for burning. To the extent above described, the stove 120 is of a substantially conventional layout.

However, the upper portions of its side walls 133, flanking the exhaust chamber 122, are provided with openings for installation of one or more devices 12 in the manner above discussed with respect to FIG. 4, as generally seen in FIGS. 5 and 6, with the fins 57 of the latter aligned along the rightward to leftward direction of exhaust gas movement through exhaust chamber 112 (as indicated by arrows A). In the preferred embodiment shown in FIG. 6, the upper portions of side walls 133 are sloped upward and inward to minimize the outside surface area of the exhaust chamber not occupied by devices 12. Unlike in conventional stoves of which I am aware, the top, bottom, side and end walls of the stove 120 are insulated against heat loss to the outside air and this insulation 136 may be of any convenient type, for example fire brick on the bottom and side walls and fiberglass mat between spaced inner and outer sheet metal walls at the top and sides of the exhaust chamber 122. The shelf 123 preferably also is insulated through its length. Further, the exhaust chamber is preferably provided with an internal baffle 138 which constrains exhaust gases from the combustion chamber 121 to flow close past the interior surfaces of the devices 12, all to maximize transfer of combustion heat to the hot plate 31 of each device 12.

In the combustion of solid fuels of nonuniform types such as wood, combustion chamber temperature may vary widely over a period of time. To avoid overheating of the devices 12, namely heating at temperatures high enough to degrade electrical connections therein, or the like, and particularly in apparatus of the FIGS. 5 and 6 type wherein a substantial amount of the combustion heat can be transferred to the devices 12, it may be desirable to provide a thermostatically controlled temperature limiting device. In FIG. 5 this takes the form of a conventional bimetallic strip located in the exhaust chamber 122 to sense the temperature thereof and connected through a chain 142 to the combustion air intake door 143 of the stove. The strip 141 holds the air intake 143 open for encouraging combustion except when the exhaust chamber temperature exceeds the desired level at which time it allows the air inlet door 143 to close and thus reduce incoming air flow and combustion and hence exhaust chamber temperature.

Upon initial starting of a fire in a stove 82 or 120 (FIGS. 5 or 8) it has been found that, due to a degree of thermal lag in bringing up the temperature of liquid in the tubes 68, the device 12 will tend to start producing some electrical output across lines 51 very soon after heating of its first plate 31 starts. By using a pump 84 of relatively low power drain, it is possible to start some movement of coolant liquid through the pipes 68 by means of the pump 84 before the liquid in pipes 68 becomes overheated. In this way, the device 12 tends to avoid becoming overheated during initial start-up of combustion in the stove 82 even though its electrical output conductors 51 may be connected to drive the pump 84 directly. However, to avoid any risk of initial overheating of the device 12 due to inadequate coolant flow through the tubes 68, the pump 84 can be driven by the battery 87, rather than directly from the output lines 51 of device 12.

Figure 7:
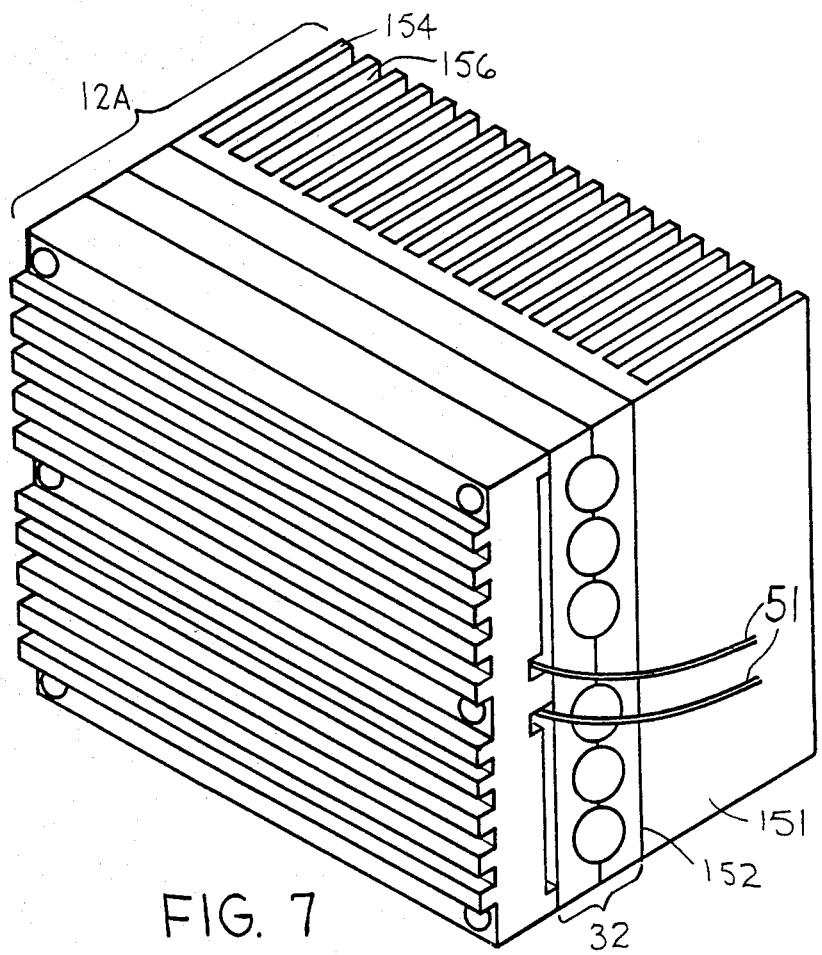
FIG. 7 is a pictorial view of the FIGS. 1-4A thermoelectric device with an accessory air cooling plate added.

Alternately, if direct driving of the pump 84 from the device 12, as shown in FIG. 8, is to be retained and extra start-up cooling of the device 12 is desired, a third, air-cooled plate 151 (FIG. 7) may be fixed in close heat conductive, wide area contact to the outer surface 152 (FIG. 4A) of the second plate 32 (for example by use of longer screws 60 extending through holes not shown in the third plate 151). The third plate 151 is provided with a plurality of upstanding fins 154 separated by vertical, top and bottom opening air flow slots 156. Air flow upward through the slots 156, due to thermocycling, will thus help remove heat from the cool plate 32 during start-up or at other times when flow through the liquid coolant tubes 68 is insufficient or nonexistent, for example at start-up or in case of failure of the liquid coolant pump 84. The efficiency of cooling by the fins 154 may be enhanced somewhat by locating the thus-modified device 12A of FIG. 7 on vertical exhaust chamber walls (as discussed hereafter with respect to FIG. 13) rather than on inwardly sloped combustion chamber side walls as in FIG. 6, although the hybrid three plate device 12A could be used in either the FIG. 6 or FIG. 13 arrangement.

In some installations, it may be desired to produce electricity from the device 12 without also using it as a source of hot water for a water storage tank 91 of the kind above discussed with respect to FIG. 8. For example, there may be installations where existing apparatus provides hot water, where hot water is not needed, or where the device 12 is to be used in a portable or semiportable, heat actuated, electricity producing system of a compact, light weight, and easily set-up nature. In such instances, the FIG. 8 water loop components 76, 77, 84, and 91–98 would be omitted as the cooling apparatus and a preferred cooling alternative such as that in FIG. 9 (or a less preferred cooling alternative such as that shown in FIG. 10) can be substituted.

Figure 9:
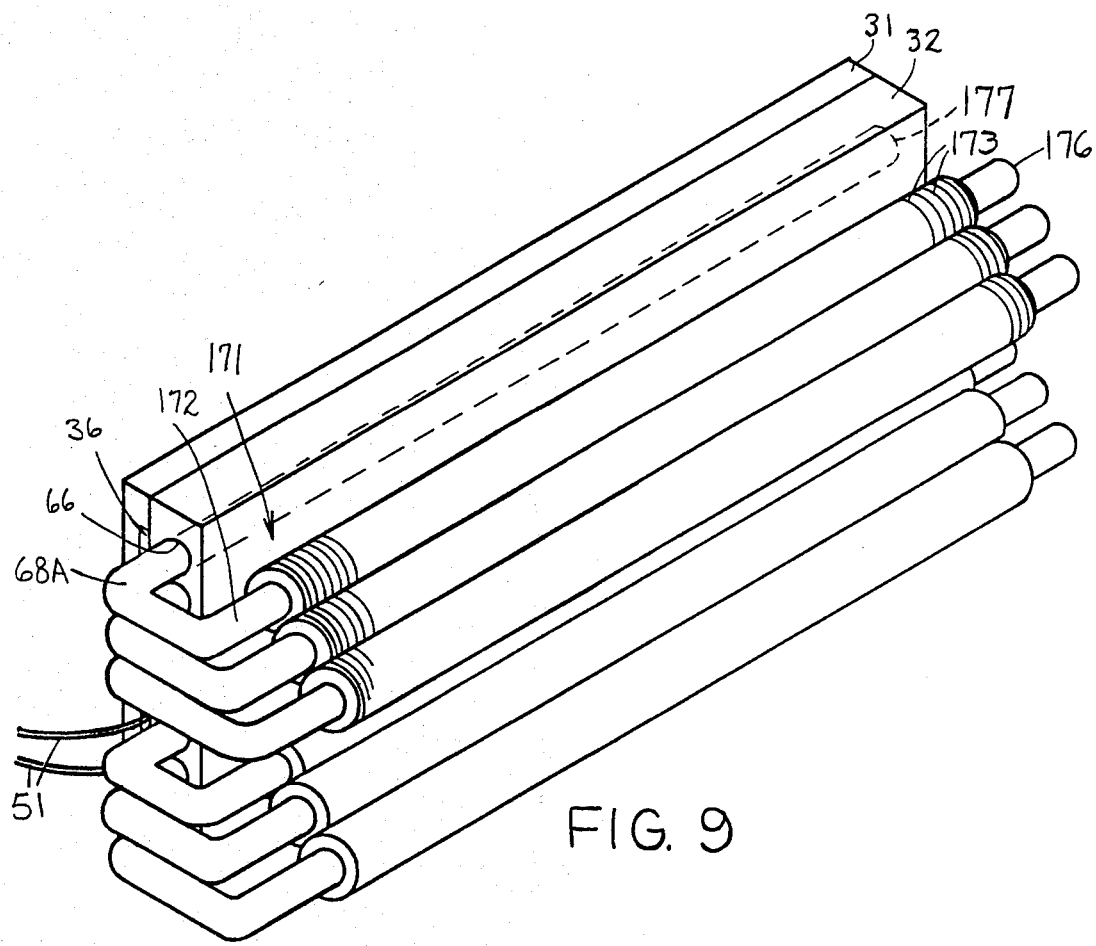
FIG. 9 is a pictorial view of a modified thermoelectric device incorporating heat pipes for cooling.

Turning to the FIG. 9 alternative, the apparatus can be identical to the thermoelectric device 12 shown in FIGS. 1–4A except that the header tubes 76 and 77 are eliminated and the cooling tubes 68 are each replaced by one leg 68A of a preferably U-shaped heat pipe 171. Each heat pipe 171 is closed at its ends to provide a sealed interior chamber running the length of the heat pipe and containing a vaporizable, condensible liquid, which in the present embodiment is conveniently water. The heated legs 68A of the heat pipes 171 extend along the lengths of the passages 66 in the second plates 32 in the manner above described with respect to the water tubes 68 of FIGS. 3 and 4A and are similarly intended to take heat away from the plate 32. The outer legs 172 of each heat pipe are provided externally with air cooling fins 173 for transferring heat to the ambient air. In the embodiment shown, the outer (cooled) legs 172 of successive heat pipes 171 are offset horizontally with respect to each other at differing distances from the second plate 32, to optimize air flow through the fins 173 and hence improve cooling of the cooled legs 172. The closed ends 176 of the outer legs 172 are preferably elevated somewhat above enclosed ends (one of which is indicated in dotted lines at 177) of the heated legs 68A. The elevation may be about $\frac{1}{4}''$ per foot of length. In this way, the need for a wick material within the heat pipes is eliminated in that water cooled and condensing in the outer legs 171 can drain by gravity into the heated legs 68A for heating and vaporization and rising back up into the cooled legs 172, so as to transfer heat from the plate 32 to ambient air and thereby cool the second plate 32.

Figure 10:
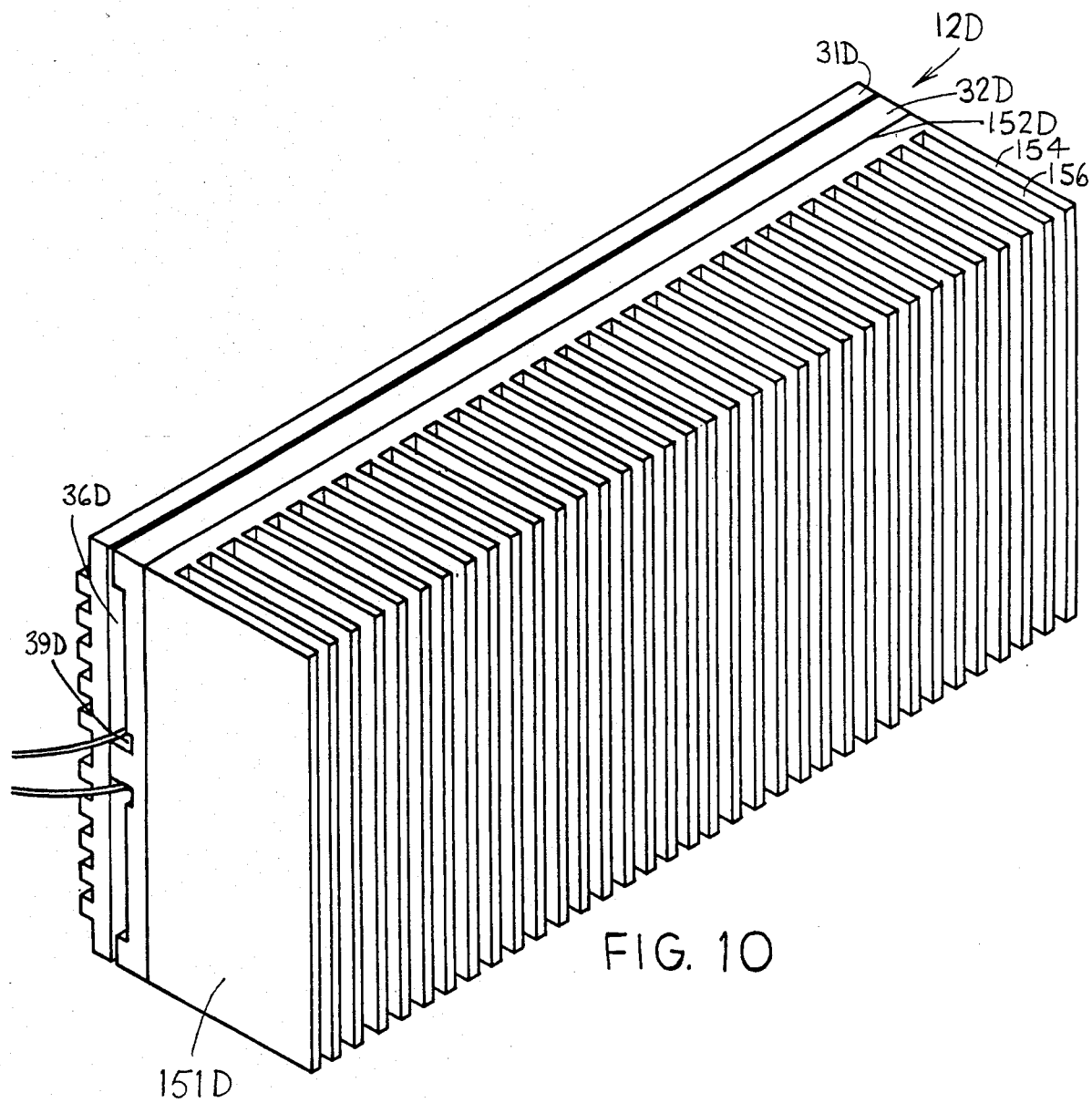
FIG. 10 is a pictorial view of a further modified thermoelectric device installable in a stove in the manner indicated in FIGS. 3-5 and 13.

A further alternative is shown in FIG. 10 though this is believed less effective for cooling than the embodiments above discussed. FIG. 10 discloses a modified thermoelectric device 12D having a heatable first plate 31D and second coolable plate 32D, which plates may be generally similar to plates 31 and 32 described above with respect to FIGS. 1–4A except for the following characteristics. For example, the recesses 36D and subrecesses 39D may be provided, as shown, in the surface of cooled plate 32D rather than heated plate 31D. Further, cooled plate 32D is not split into subplates as in FIGS. 1–4A and can be of lesser thickness than plate 32 since no cooling passages or cooling tubes are provided therein. Instead, the outer (rightward in FIG. 10) surface 152D of cooled plate 32D has mounted thereon in wide area heat conducting relation, an air cooled third plate 151D, preferably similar to and indeed which may be identical to the plate 151 of FIG. 7, being provided with similar fins 154 separated by vertically open grooves 156 for cooling air flow by thermocycled flow.

Figure 13:
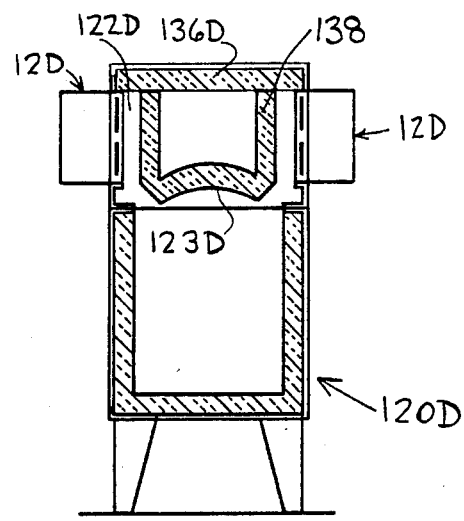
FIG. 13 is a view similar to FIG. 6 but showing a modification.

FIG. 13 shows a stove 120D similar to stove 120 of FIG. 6 but modified in its upper end portion to better suit the needs of air cooled thermoelectric devices like that at 12D of FIG. 10, although usable with other thermoelectric devices. Because thermosiphon air cooling works best with the grooves 156 between fins vertically aligned, the upper portion of stove 120D has its upper walls vertically aligned (not canted inward as in FIG. 6). However, this means that less of the external surface area of the exhaust chamber is covered by the thermoelectric devices 12D and the exhaust chamber surface area left to be insulated against heat loss to the outside air, as at 136D, is increased, such that the FIG. 6 apparatus may be expected to be more efficient than that of FIG. 13. In view of the widening of the exhaust chamber 122D, by making its side walls vertical rather than tilted inward, the baffle 138D is changed in shape from the shape of baffle 138. Also, in the embodiment shown, it is the bottom of the U cross section baffle 138 which provides the function of the shelf 123 and thus such bottom 123D does not extend the full width of the top of the combustion chamber allowing high combustion gases to arise not only along the front wall of the stove 120D but also to a limited extent along the sides thereof before exiting through a suitable stove pipe P (FIG. 5).

Figure 11:
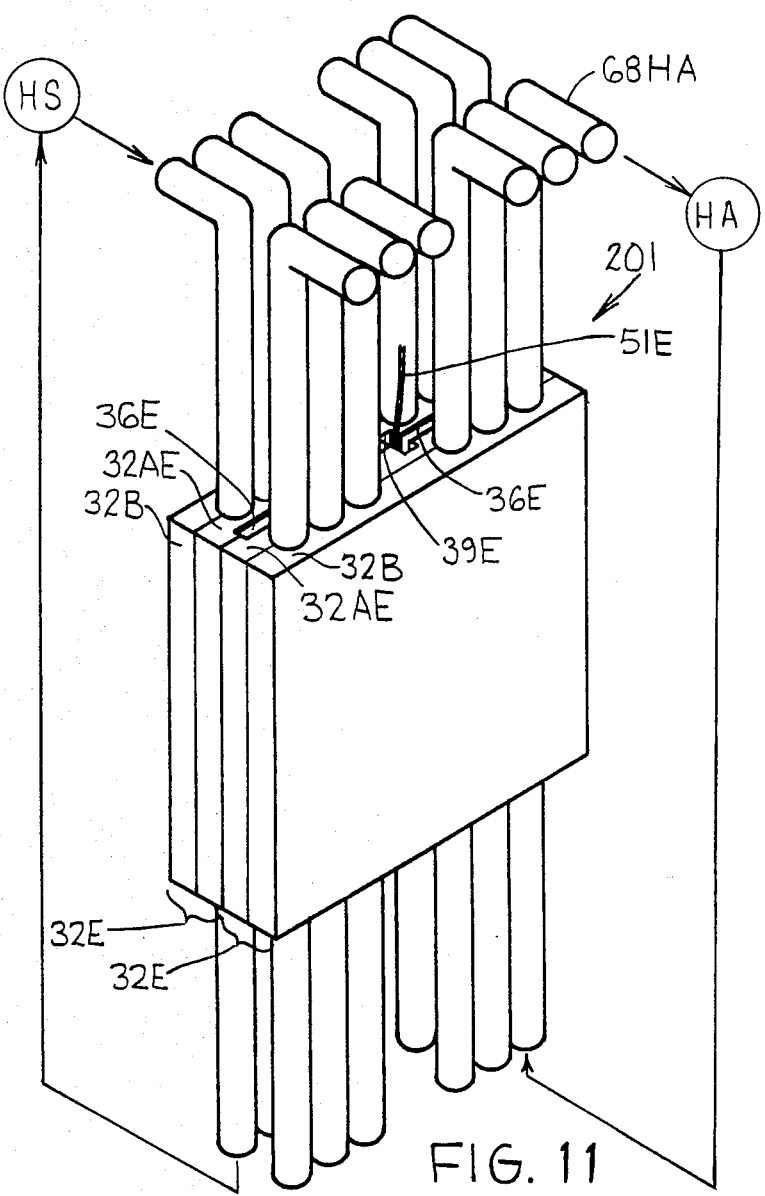
FIG. 11 is a modified thermoelectric device utilizing a liquid type heat source and heat acceptor.

It is contemplated that the split second plate 32 of FIGS. 1–4A can be duplicated in a second such plate and, with slight modification, utilized as a liquid-to-liquid heat exchanger as shown generally at 201 in FIG. 11. Thus, FIG. 11 provides two split plates 32E each comprising an outer subplate 32E which may be identical to the subplate 32B of FIGS. 1–4A and an inner subplate 32AE. Inner subplates 32AE may be similar to above-described subplates 32A and 32B of FIGS. 1–4A except each is partially relieved to together provide recesses 36E and subrecesses 39E generally corresponding to recess 36 and subrecess 39 of FIGS. 1–4A, for accommodating platelike thermoelectric devices 16 snugly therebetween. In addition, FIG. 11 for heat transfer purposes is provided with liquid carrying tubes 68HS connectible for circulating heated liquid from a heat source HS through the leftward or heated one of the split plates 32E and tubes 68HA for circulating cooled liquid through a heat acceptor HA to cool the other split plate 32E, so as to cause the thermoelectric members 16 (not shown) within the recesses 36E to produce a voltage across the output conductors 51E.

Figure 12A:
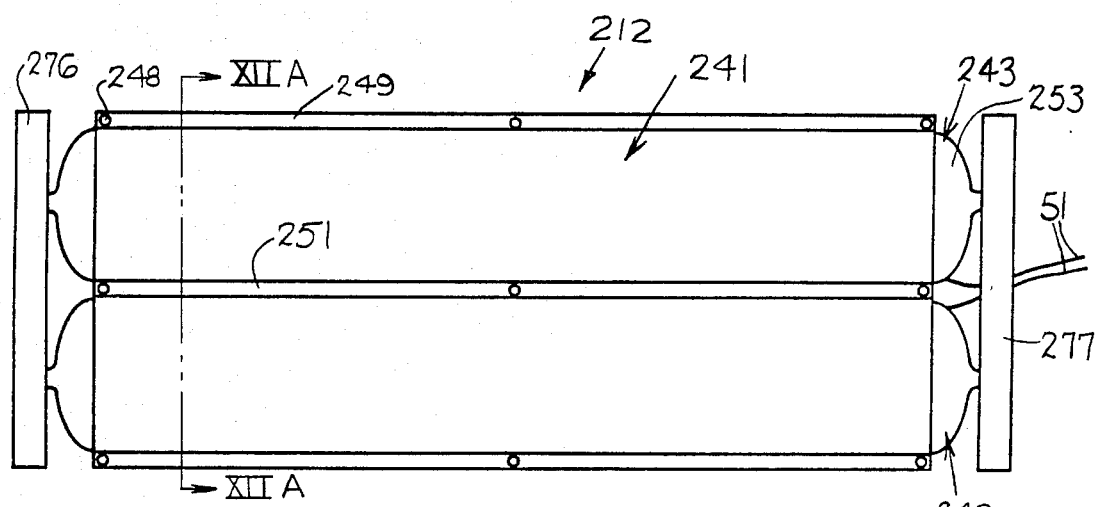
FIG. 12A is an elevational view of the coolable side of a further modified thermoelectric device embodying the invention.
Figure 12B:
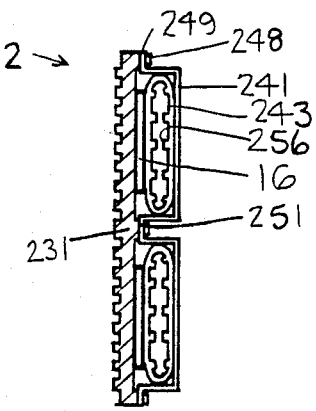
FIG. 12B is a sectional view generally taken on the line XII—XII of FIG. 12.

Although the second, or coolable, plate 32 of FIGS. 1–4A has been found to be an advantageous device from the standpoint of manufacturing efficiency and operating efficiency, consideration has been given to a modified thermoelectric device structure 212 (FIGS. 12A and 12B). The device 212 includes a first plate 231 which may be at least generally similar to plate 31 of FIGS. 1–4A. The plate 32 of FIGS. 1–4A is however replaced by a generally M cross section, rigid, clamping sheet of a temperature resistant material such as sheet steel or other metal. A pair of fluid carrying cooling tubes 243 are pressed in spaced side-by-side relation toward the first, heated plate 231 to snugly, and in wide area heat conductive contact, sandwich therebetween an array of thermoelectric members 16 like that shown in FIG. 3, for supplying electric current through the conductors 51. Screws 248 through the depressed side edge and central narrow portions 249 and 251 of the sheet 241 clamp the sandwiching tubes 243 and plate 231 tightly in close thermal contact with the thermoelectric members 16. To cool the tubes 243 and thus create a temperature differential across the thermoelectric members 16, the ends of the tubes 243 are connected by funnellike end caps 253 to header tubes 276 and 277 like those above described at 76 and 77 with respect to FIGS. 1–4A, to permit the apparatus of FIGS. 12A and 12B to be used for example in a circuit of the kind shown in FIG. 8. If desired, and to increase somewhat the transfer of heat to liquid within the tubes 243, the latter may be provided with internal rifling fins 256

(FIG. 12B). Again, as in FIGS. 1–4A, it will be understood that contact between the surfaces of the thermoelectric member 16 and the first plate 231 and tubes 243 is through a surface layer of high electrical resistance and dielectric strength which also interferes very little if at all with the heat transfer across the thickness thereof, so as to maximize the heat transfer with respect to the thermoelectric member 16 but yet avoid shorting of the adjacent links 20 on the hot side thereof and links 23 on the cold side thereof.

Although particular preferred embodiments of the invention have been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A thermoelectric electricity generating system for connection with a heat source and a heat acceptor comprising a source of fluid at a temperature less than that of the heat source, said system comprising:

first and second elongate plates of substantially constant cross section and of high heat and electrical conductivity metal, said first and second plates being releasably connected in facing relation with opposing inner surfaces, at least one said opposing inner surface being formed with an elongate recess extending lengthwise of the corresponding said plate;

a plurality of flat, platelike thermoelectric members disposed edge by edge along said recess and snugly sandwiched between said first and second plates, said thermoelectric members each comprising a plurality of heatable junctions on one side facing said first plate and a plurality of coolable junctions on the other side facing said second plate;

a surface layer which is very thin compared to the thickness of said plates and has a conductivity relatively high as to heat and relatively low as to electricity, said surface layer establishing wide area contact of said heatable and coolable junctions with the opposed first and second plates, respectively, so as to transfer heat from said first plate to one side of said thermoelectric member and from the other side of said thermoelectric member to said second plate without electrically shorting adjacent junctions on either side of said thermoelectric member, each said thermoelectric member having a pair of electrical output terminals, the output terminals of said thermoelectric members being aligned along said recess and connected to electric output lines, said first and second plates being respectively thermally coupleable to said heat source and said source of lower temperature fluid.

2. The system of claim 1 in which said recess has a deeper subrecess extending along one length edge thereof, said output terminals of said thermoelectric members extending over said subrecess, conductive links connecting adjacent output terminals of adjacent thermoelectric members in said recess, and electrical conductors connected to the endmost pair of output terminals in said recess for supplying electric power in response to a difference in temperature between said heat source and source of fluid.

3. The system of claim 2 in which said first plate includes a side-by-side, longitudinally extending pair of said recesses with the subrecesses thereof being closely adjacent, said first plate having a pair of raised edge portions flanking said recesses and a third raised portion separating said subrecesses, means rigidly clamping said plates together against said thermoelectric members, said clamping means comprising threaded fasteners securing said first and second plates along said raised portions of said first plate.

4. The system of claim 1 in which said second plate comprises inner and outer subplates respectively disposed adjacent said first plate and spaced from said first plate by said inner subplate, a plurality of parallel elongate passages extending longitudinally at the inner face of said inner and outer subplates with opposed halves of said passages in said inner and outer subplates, said plural passages being close spaced to each other and clustered adjacent said recess in said first plate, thermally conductive tubes snugly received in respective ones of said passages and clamped by clamping together said inner and outer subplates, heat conductive material in a thin film between said subplates and between the surface of said tubes and subplates for enhancing heat transfer from said subplates to fluid in said tubes, said tubes being connected to said source of lower temperature fluid.

5. The system of claim 4 in which said inner and outer subplates are identical with one rotated through 180° into facing contact with the other to form said passages, the outward facing sides of said subplates being smooth and flat to provide wide area heat conductive contact of the inner subplate with said first plate for cooling said other side of said thermoelectric members.

6. The system of claim 5 in which the outward facing side of at least said inner subplate carries said surface layer.

7. The apparatus of claim 4 including a said heat source for heating said first plate and a said source of fluid at less than the temperature of said heat source for cooling said second plate relative to said first plate, a water tank and an electric pump connected in series loop with said tubes for circulating water therethrough and thereby extracting waste heat from said second plate to cool it and heating water in the tank with such waste heat while said thermoelectric members produce electricity in response to heating and cooling of opposite sides thereof by said first and second plates.

8. The system of claim 7 in which said electric output lines are connected to the motor of said pump for driving same and thereby circulating water through said tubes and tank.

9. The system of claim 8 including a third plate connected in wide area surface contact with the outer surface of said outer subplate, said third plate having a plurality of outwardly extending fins separated by substantially vertical slots for passage of air upward through said slots in a thermosiphoning manner, initial application of heat to said first plate thereafter progressively causing transfer of heat to said thermoelectric member and therebeyond to said second plate, thermal lag providing an initial temperature differential between the cool and hot junctions of said thermoelectric members, the fins of said third plate tending to cool same and said second plate sufficient for generation of enough electricity by said thermoelectric elements to initiate operation of said pump to move water from said tank through said tubes and thereby further cool said second plate and permit a higher temperature differential and more electrical output at said thermoelectric members.

10. The system of claim 4 including a plurality of heat pipes each having a heated end and a cooled end, the heated end of said heat pipes comprising said tubes sandwiched between said inner and outer subplates, the outer ends of said heat pipes being disposed outside said first and second plates and away from the heat source, the outer ends of said heat pipes carrying a plurality of ambient air engaging members for cooling by ambient air, said heat pipes containing said fluid, the outer ends of said heat pipes being raised slightly with respect to the inner ends thereof to promote gravity flow of condensed fluid from the outer end toward the inner end of each heat pipe, while permitting flow of vaporized fluid from the inner end to the outer end thereof.

11. The system of claim 1 including a fire chamber which defines said heat source, said fire chamber having walls for containing a fire therein, said first plate being a part of a wall of said fire chamber and facing directly thereinto for receiving heat from the fire therein.

12. The system of claim 11 including an opening through a wall of said fire chamber, said first plate being located in said opening, bracket means fixed rigidly to the exterior of the fire chamber wall along at least a pair of opposite edges of said opening, said bracket including a flange extending exteriorly from said wall of said fire chamber and along the adjacent edge of said second plate, at least two adjustable compression members spaced along the opposed flanges and bearing against the adjacent edge of said second plate with a minimal contact area, said contact area being very much smaller than the area of the corresponding edge of the second plate, said first and second plates being fixed with respect to said opening in said wall solely by compressive contact of said compression members with the opposed edges of said second plate, the area of such contact being minimized to minimize transfer of heat from said fire chamber wall to said second plate, and a heat insulating seal material closing the space between the edge of the opening and the opposed edges of said first and second plates to prevent passage of air or combustion gases therethrough.

13. The system of claim 11 including a fuel burning firebox as said fire chamber and having a lower chamber in which fuel is burned, at least the bottom and side walls thereof being insulated to minimize heat loss to outside, an exhaust chamber above said combustion chamber and extending substantially horizontally therealong, one end of said exhaust chamber communicating with said combustion chamber for exhausting hot combustion products therefrom, the rest of said exhaust chamber having an insulated floor isolating same from said combustion chamber, the opposite end of said exhaust chamber being open to an outlet to carry combustion products away from said heat source, the top and side walls of said exhaust chamber being insulated to prevent heat loss to the outside air, except for length extending portions of said exhaust chamber walls which are formed by said first plate of one or more thermoelectric generating units comprised of a said first plate, second plate and thermoelectric elements, said second plate facing outward and away from said fuel burning firebox, and internal baffle means within said exhaust chamber for forcing hot combustion products to flow close to and along each said first plate to maximize transfer of heat thereto.

14. The system of claim 13 including means defining water passages extending along said second plate adjacent to and along said recess for circulating a cooling liquid in said passages so as to cool the corresponding side of said thermoelectric elements, the walls of said exhaust chamber incorporating said first plates converging upward to maximize the surface area of said exhaust chamber defined by said first plates.

15. The apparatus of claim 13 in which said second plates are cooled by outside air flow past fins extending outward from said second plates, the side walls of said exhaust chamber being upright and incorporating said first plates as parts thereof, such that grooves between said fins are vertical and open at their upper and lower ends to maximize air flow past the fins through thermosiphoning.

16. The system of claim 1 in which said second plate comprises an elongate tube of flattened cross section having relatively flat inner and outer surfaces, the relatively flat inner surface of said flattened tube bearing on said other side of said thermoelectric members, liquid headers extending along the ends of said tube and first plate and establishing a liquid flow connection with said tube ends, said second plate further including a hold-down panel engaging the outside of said tube, fasteners spaced along the length of said first plate on opposite sides of said recess and tube for causing said panel and said first plate to clamp said tube and thermoelectric elements snugly therebetween.

17. The system of claim 1 in which said first and second plates are of aluminum and said surface layer comprises an anodized layer on the opposed faces of said aluminum plates.

18. The system of claim 1 in which said surface layer covers at least the opposite side surfaces of said thermoelectric devices and comprises a greaselike material loaded with alumina powder, and including means clamping said first and second plates snugly on said thermoelectric devices.

19. The system of claim 1 in which said surface layer covers at least the opposite side surfaces of said thermoelectric devices and comprises a high temperature adhesive material loaded with aluminum particles, and which serves to fix said first and second plates snugly to said thermoelectric devices.

20. The system of claim 1 in which said first and second plates each comprise inner and outer subplates having parallel passages extending the width of said subplates at the interface of each inner and outer subplate, fluid conducting tubes located snugly in and extending through and beyond corresponding said passages and means between the opposed surfaces of said subplates and the exterior surfaces of said tubes and subplates for ensuring maximum area, highly heat conductive contact therebetween, said tubes in said first plate being connectible to a heat source, the pipes in said second plate being connectible to said fluid source at lower temperature than said heat source for imposing a temperature differential across said thermoelectric members.

21. A thermoelectric electricity generating system comprising:
 a heat source comprising walls surrounding a combustion chamber;
 a thermoelectric device comprising first and second elongate plates of substantially constant cross section releasably connected in facing relation with opposing inner surfaces, at least one said opposing inner surface being formed with an elongate recess extending lengthwise of the corresponding said plate;

a plurality of thermoelectric members disposed edge by edge along said recess;

a surface layer which is very thin compared to the thickness of the plates and has a conductivity relatively high as to heat and relatively low as to electricity, said surface layer establishing wide area contact of said thermoelectric member between said first and second plates for heating on one side by said first plate and cooling on said other side by said second plate;

electrical conductors interconnecting output terminals of said thermoelectric members for providing an electrical output in response to such heating and cooling of the opposite sides of said thermoelectric members;

the wall of said combustion chamber having an opening therethrough, said first plate substantially occupying said opening and having an exposed side facing into said combustion chamber in direct heat receiving relation therewith, said second plate being cooled by a connection to a source of fluid at a temperature less than the temperature in said combustion chamber.

* * * * *

UNITED STATES PATENT AND TRADEMARK OFFICE
CERTIFICATE OF CORRECTION

PATENT NO.  :   4 520 305
DATED       :   May 28, 1985
INVENTOR(S) :   Charles J. Cauchy It is certified that error appears in the above-identified patent and that said Letters Patent is hereby corrected as shown below:

Column 16, line 56; change "the pipes" to ---the tubes---.

Column 17, line 11; change "heating on one side" to ---heating of said thermoelectric members on one side---.

Column 17, line 12; change "on said other side" to ---on the other side---.

Signed and Sealed this

Tenth Day of December 1985

[SEAL]

Attest:

DONALD J. QUIGG

Attesting Officer     Commissioner of Patents and Trademarks